(12) United States Patent
Kumamoto et al.

(10) Patent No.: US 6,573,588 B1
(45) Date of Patent: Jun. 3, 2003

(54) CAPACITANCE ELEMENT

(75) Inventors: Toshio Kumamoto, Tokyo (JP); Takashi Okuda, Tokyo (JP); Yasuo Morimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/278,943

(22) Filed: Oct. 24, 2002

(30) Foreign Application Priority Data

May 13, 2002 (JP) ........................................ 2002-137331

(51) Int. Cl.$^7$ .............................................. H01L 29/00
(52) U.S. Cl. ........................ 257/532; 257/535; 257/528; 257/371; 257/372; 257/386; 257/401
(58) Field of Search ................................ 257/532, 535, 257/528, 371, 372, 386, 394, 401

(56) References Cited

U.S. PATENT DOCUMENTS 5,293,055 A * 3/1994 Hara et al. ................... 257/296
5,838,047 A * 11/1998 Yamauchi et al. ........... 257/372
6,034,391 A * 3/2000 Tobita ......................... 257/306
6,365,954 B1 * 4/2002 Dasgupta .................... 257/532
6,465,868 B1 * 10/2002 Ehben et al. ................ 257/532

OTHER PUBLICATIONS

Narain Arora, "MOSFET Models for VLSI Circuit Simulation, Theory and Practice," 1993, pp. 52–57, 146–151, Springer–Veriag Wien, New York, USA.

* cited by examiner

Primary Examiner—Nathan J. Flynn
Assistant Examiner—Remmon R. Fordé
(74) Attorney, Agent, or Firm—Burns, Doane, Swecker & Mathis, LLP

(57) ABSTRACT

A P well region formed on a buried N well region and a n+ active region that are connected each other through a lead wire, serve as one terminal T1, and a gate electrode and a buried N well region that are connected each other through a leading N well region and a lead wire, serve as the other terminal T2. Thereby, the voltage dependence of capacitance C1 formed between the gate electrode and the n+ active region is canceled out with the voltage dependence of capacitance C2 formed between the P well region and the buried N well region.

5 Claims, 7 Drawing Sheets

CAPACITANCE ELEMENT

BACKGROUND OF THE INVENTION

1. Field of the Invention

The present invention relates to a capacitance element in a semiconductor integrated circuit, and more particularly relates to a capacitor structure in CMOS processes.

2. Description of the Prior Art

Figure 7:
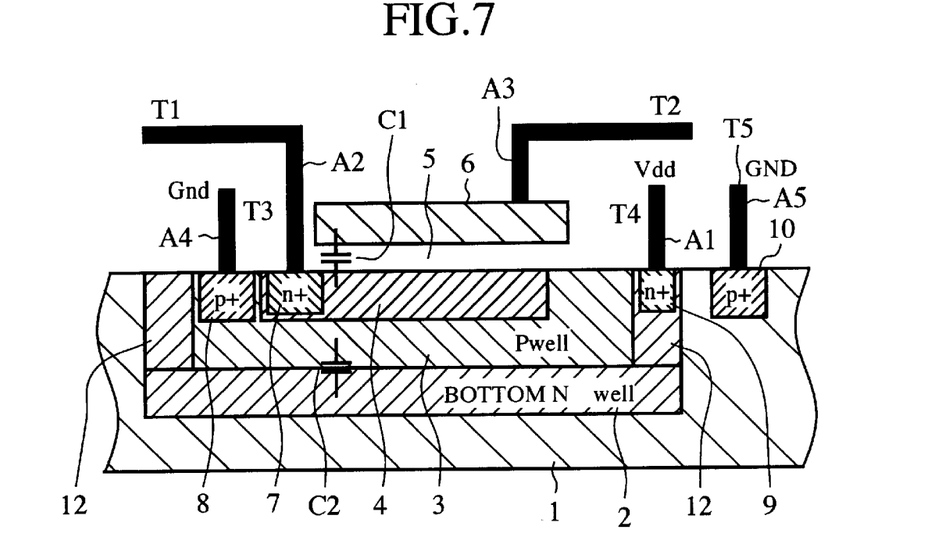
FIG. 7 is a schematic sectional view showing the capacitance element of a conventional example 1.

FIG. 7 is a schematic sectional view showing a capacitance element of a conventional example 1. Referring to the figure, reference numeral 1 denotes a p type semiconductor substrate; 2 denotes a buried N well region (also referred to as a bottom N well); 3 denotes a P well region; 4 denotes a n+ active region in which the concentration of an type impurity is high; 5 denotes an insulation film such as an oxide film; 6 denotes a gate electrode formed of polysilicon or the like; 7 denotes a n+ active region; 8 denotes a p+ active region; 9 denotes another n+ active region; 10 denotes another p+ active region; and 12 denotes a N well region that electrically leads out the buried N well region 2 to the upper portion. Here, "n+" and "p+" represent that the concentrations of a n type impurity and a p type impurity are high, respectively.

In addition, reference symbol A1 represents a lead wire from the n+ active region 9, and the lead wire A1 is connected with a power supply Vdd. A2 represents a lead wire from the n+ active region 7; A3 represents a lead wire from the gate electrode 6; A4 represents a lead wire from the p+ active region 8; and A5 represents a lead wire from the other p+ active region 10. The lead wire A5 is connected with the ground GND.

Further, reference symbol T1 represents one terminal that is formed by electrically connecting the lead wire A2 and the n+ active region 7, and T2 represents the other terminal that is formed by electrically connecting the lead wire A3 and the gate electrode 6. T3 and T5 each represent a ground terminal connected with the ground GND, and T4 represents a power supply terminal connected with the power supply Vdd. Additionally, C1 represents a capacitance formed between the gate electrode and the n+ active region 4 that was formed by means of n+ implantation (the high-concentration implantation of an n-type impurity or dopant), and C2 represents capacitance formed between the buried N well region 2 and the P well region located on the N well region 2.

Figure 8:
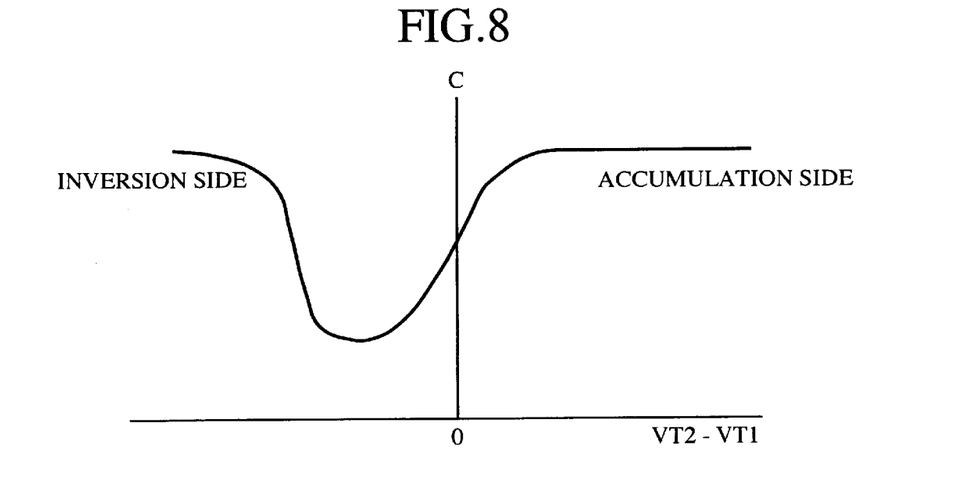
FIG. 8 is a CV curve showing the voltage dependence of the capacitance value in the capacitance element shown in FIG. 7.

FIG. 8 is a CV curve showing the voltage dependence of a capacitance value in the capacitance element of the conventional example 1, and the horizontal axis shows the potential of the terminal T2 to the terminal T1. As is apparent from the CV curve, the capacitance value reduces as the potential reduces from the vicinity of 0 V toward the inversion side, and shows the curve that projects downward. Such voltage dependence becomes a problem when building an analog circuit.

Figure 9:
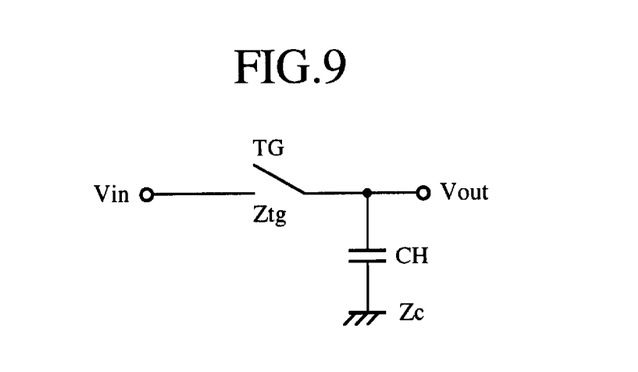
FIG. 9 is an example of the sample holding circuits.

An example of a circuit in which the voltage dependence of the capacitance causes the accuracy deterioration of the circuit will now be shown as below. FIG. 9 is a sample holding (S/H) circuit having the simplest configuration. Referring to the figure, the circuit is composed of a switch TG and a holding capacitor CH. Vin represents an input terminal, and Vout represents an output terminal.

The operation will next be described below.

The output signal of this sample holding circuit is received by a buffer amplifier (not shown) usually having extremely high input impedance, and is sent to the following step. The switch TG is turned on during a sampling period, and thereby the analog input voltage applied to the input terminal is applied to the capacitor CH. The switch TG is turned off during a holding period, and the charge having been accumulated in the capacitor CH for the sampling period is thereby maintained. The analog voltage on hold is then output through a buffer circuit AMP having a high input impedance.

Figure 10:
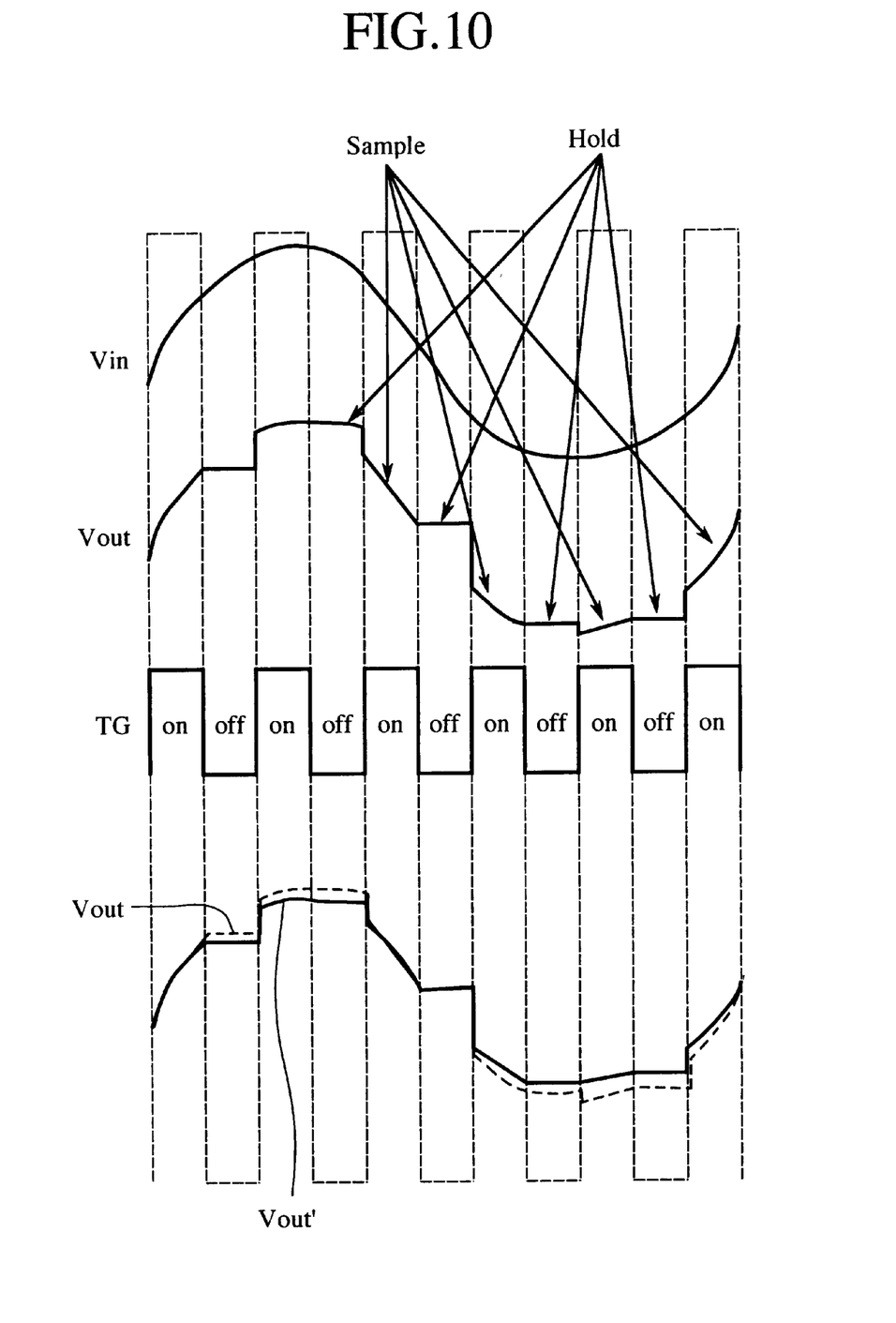
FIG. 10 is a timing diagram showing the operation waveforms of the sample holding circuit shown in FIG. 9.

FIG. 10 shows how such a sample holding circuit operates, by use of the operation waveforms. The vertical axis shows the voltage, and the horizontal axis shows the time. Referring to the figure, Vin shows the input voltage, Vout shows the output voltage at the normal operating time, and TG shows the clock wave. TG shows the sampling period (on) and the holding period (off).

The operation at that time will next be described in a little more detail. More specifically, for the "ON" period when the analog input is sampled into the holding capacitor, the input voltage Vin is divided by the on resistance Ztg of the switch TG and the impedance Zc formed by the capacitor CH, and thereby a voltage that is slightly different from the input voltage is applied to the capacitor CH. For the "OFF" (holding) period, the voltage having been applied to the capacitor CH for the sampling period is held, and the voltage is output as an averaged voltage.

As is apparent from the operation thereof, the voltage applied to the capacitor CH is distorted when the resistance of the switch TG or the capacitance of the capacitor CH has voltage dependence. The resistance of a switch usually has voltage dependence, but the influence thereof can be reduced by means of using a large switch. However, there is nothing to be done about the influence of the voltage dependence of the capacitor. It has been difficult to produce a sample holding circuit having a higher degree of accuracy than a certain level.

Referring to FIG. 10, Vout' shows how the accuracy of the waveform is reduced by the voltage dependence. The actual distortion of the voltage cannot be shown in such a figure, but the distortion can be observed by means of highly accurate measurement. The figure is slightly exaggerated for purposes of illustration.

Figure 11:
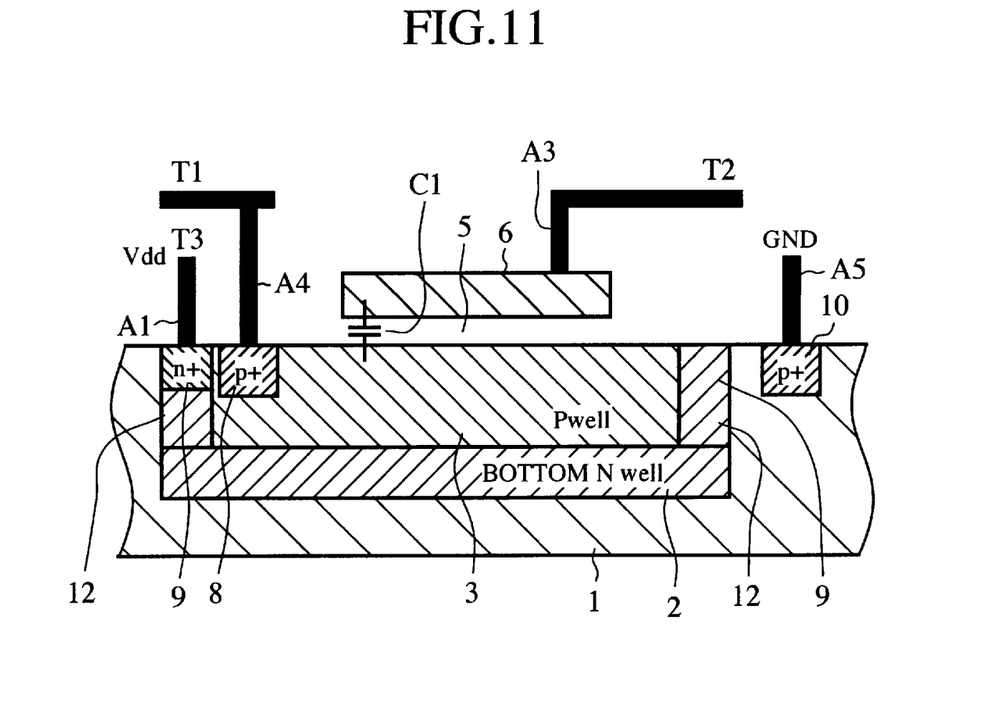
FIG. 11 is a schematic sectional view showing the capacitance element of a conventional example 2.

The capacitance element of a conventional example 2 will next be illustrated in FIG. 11. Referring to the figure, reference numeral 1 denotes a p type semiconductor substrate; 2 denotes a buried N well region (bottom N well); 3 denotes a P well region; 5 denotes an insulation film such as an oxide film; 6 denotes a gate electrode formed of polysilicon or the like; 8 denotes a p+ active region; 9 denotes another n+ active region; 10 denotes a lead wire from another p+ active region 8; and 12 denotes a N well region that electrically leads out the buried N well region 2 to the upper portion. Reference symbol A1 represents a lead wire from the n+ active region 9, and the lead wire A1 is connected with a power supply Vdd. A3 represents a lead wire from the gate electrode 6; A4 represents a lead wire from another p+ active region 8; and A5 represents a lead wire from the other p+ active region 10, and is connected with the ground GND.

Further, reference symbol T1 represents one terminal that is formed by electrically connecting the lead wire A4 and the p+ active region 8, and T2 represents the other terminal that is formed by electrically connecting the lead wire A3 and the gate electrode 6. T3 represents a power supply terminal, and T5 represents a ground terminal. Additionally, C1 represents capacitance formed between the gate electrode 6 and the p well region 3.

Figure 12:
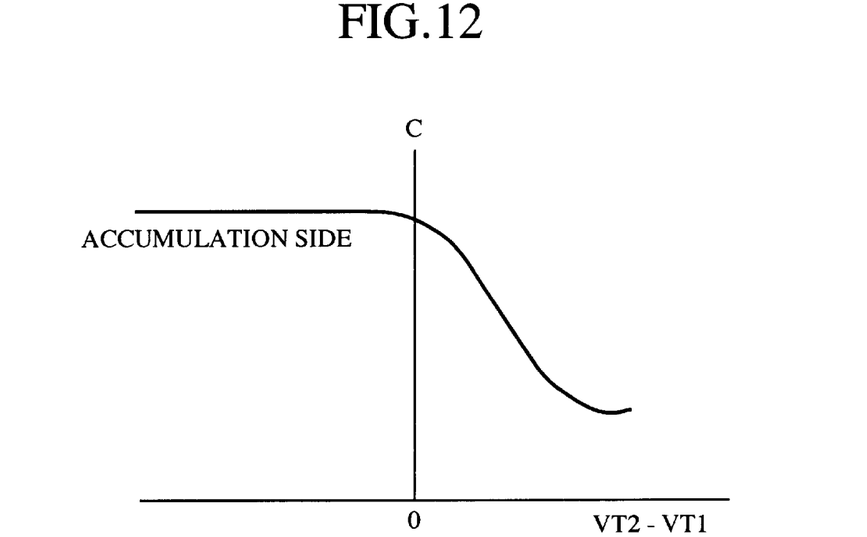
FIG. 12 is a CV curve showing the voltage dependence of the capacitance value in the capacitance element shown in FIG. 11.

FIG. 12 is a CV curve showing the voltage dependence of a capacitance value in the capacitance element of the conventional example 2, and the horizontal axis shows the potential of the terminal T2 to the terminal T1. As is apparent from the figure, the voltage dependence appears from the vicinity of zero bias voltage also in the capacitance element of the conventional example 2 illustrated in FIG. 11 similarly to the conventional example 1 illustrated in FIG. 7. Therefore, the accuracy of the circuit is reduced by the voltage dependence of the capacitance also in this capacitance element.

In the conventional example 1 illustrated in FIG. 7, the increase of the impurity concentration in the n+ region can reduce the voltage dependence of the capacitance element. However, the voltage dependence thereof slightly remains even if the method is used. In this respect, the increasing process of the impurity concentration in the n+ region in the conventional example 2 illustrated in FIG. 11 can be performed without adding the masks. However, the voltage dependence in the conventional example 2 is usually higher than the one in the case of FIG. 7.

Since the conventional capacitance element is arranged as mentioned above, the voltage dependence thereof has been reduced, for instance, by forming the n+ active region under the gate electrode by use of dedicated masks, thereby increasing the amount of the implanted impurity in the n+ region, and forming a capacitance between the n+ active region and the gate electrode. Therefore, the number of required photomasks increases, and the processing time for the implantation of high-concentration impurity increases. As a result, there has been a drawback that the cost of manufacturing becomes large.

SUMMARY OF THE INVENTION

The present invention has been accomplished to solve the above-mentioned problem. An object of the present invention is to provide a capacitance element in which the voltage dependence of the MOS capacitance therein is canceled out, and which thereby can be used for high-precision analog circuits.

A capacitance element according to the present invention includes: a first conduction type well region formed on a second conduction type buried well region; a second conduction type active region having a high concentration of the impurity, and formed on the first conduction type well region; and a gate electrode disposed on the active region through an oxide film, wherein the second conduction type active region and the first conduction type well region that are electrically connected with each other serve as one terminal, and the gate electrode and the buried well region that are electrically connected with each other serve as the other terminal. Accordingly, according to the present invention, the voltage dependence of the capacitance element can be improved by relatively adjusting the areas of the active region and the buried well region.

A capacitance element according to the present invention includes: a first conduction type well region formed on a second conduction type buried well region; a gate electrode disposed on the first conduction type well region through an oxide film; a leading second conduction type well region formed on the buried well region, for electrically leading out the buried well region; a first conduction type active region having a high concentration of the impurity, and disposed on the leading well region; and a second conduction type active region having a high concentration of the impurity, and also disposed on the leading well region, wherein the first conduction type well region and the second conduction type active region in which the concentration of the impurity is high, which are connected with each other serve as one terminal, and the gate electrode and the first conduction type active region which are electrically connected with each other serve as the other terminal. Accordingly, according to the present invention, the voltage dependence of the capacitance element can be improved by relatively adjusting the areas of the active regions.

DETAILED DESCRIPTION OF THE PREFERRED EMBODIMENTS

An embodiment of the present invention will be described below.

Embodiment 1

Figure 1:
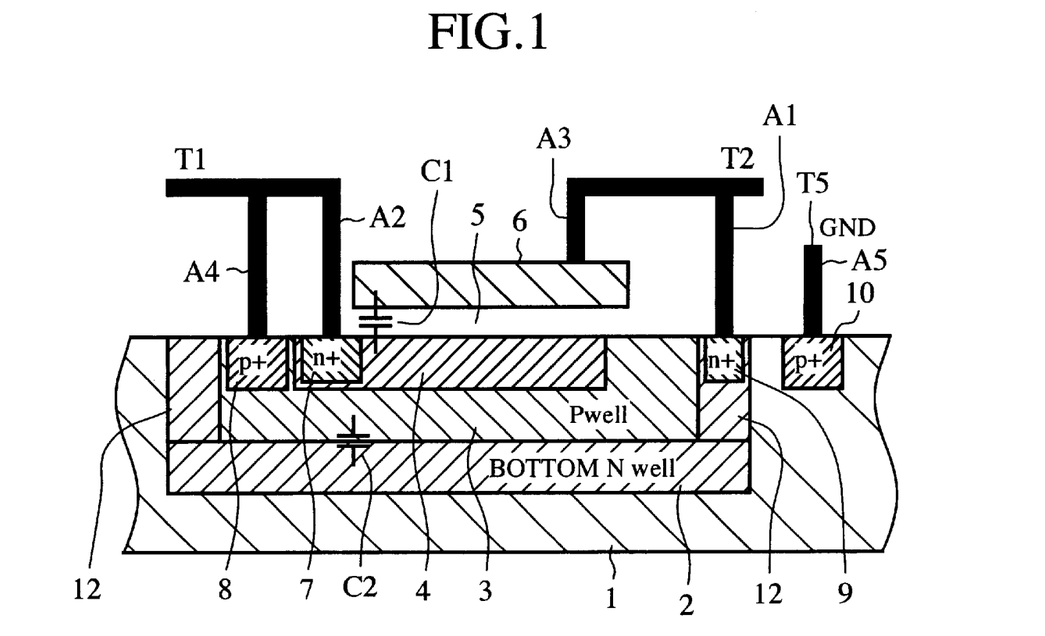
FIG. 1 is a schematic sectional view showing the capacitance element in accordance with an embodiment 1 of the present invention.

FIG. 1 is a schematic sectional view showing a capacitance element in accordance with an embodiment 1 of the present invention. Referring to the figure, reference numeral 1 denotes a p type (first conduction type) semiconductor substrate; 2 denotes a buried N well region (also referred to as "bottom N well") within a n type (second conduction type) region; 3 denotes a P well region (well region) within a p type region; 4 denotes a n+ implanted region, that is, an active region doped highly with a n type impurity (referred to as "n+ region", hereinafter); 5 denotes an insulation film such as an oxide film; 6 denotes a gate electrode formed of polysilicon or the like; 7 denotes a n+ active region formed within the n+ region; 8 denotes a p+ active region formed within the P well region 3; 9 denotes another n+ active region formed on leading N well region 12; 10 denotes another p+ active region formed outside the area of the buried N well region 2; and 12 denotes a leading N well region that electrically leads out the buried N well region 2 to the upper portion. The reference symbol A1 represents a lead wire from the n+ active region 9; A2 represents a lead wire from the n+ active region 7; A3 represents a lead wire from the gate electrode 6; A4 represents a lead wire from the p+ active region 8; and A5 represents a lead wire from (the other) p+ active region 10. The lead wire A5 is connected with the ground GND.

In the figure, reference symbol T1 represents one terminal, and connects the lead wire A2 from the n+ active region 7 and the lead wire A4 from the p+ active region 8. T2 represents the other terminal of the lead wire that connects the lead wire A3 from the gate electrode 6 and the lead wire A1 from the n+ active region 9. T5 represents a ground terminal connected with the lead line A5. Additionally, C1 and C2 represent a capacitance formed between the gate electrode 6 and the n+ region 4, and a capacitance formed between the P well region 3 and the buried N well region 2, respectively.

Figure 2:
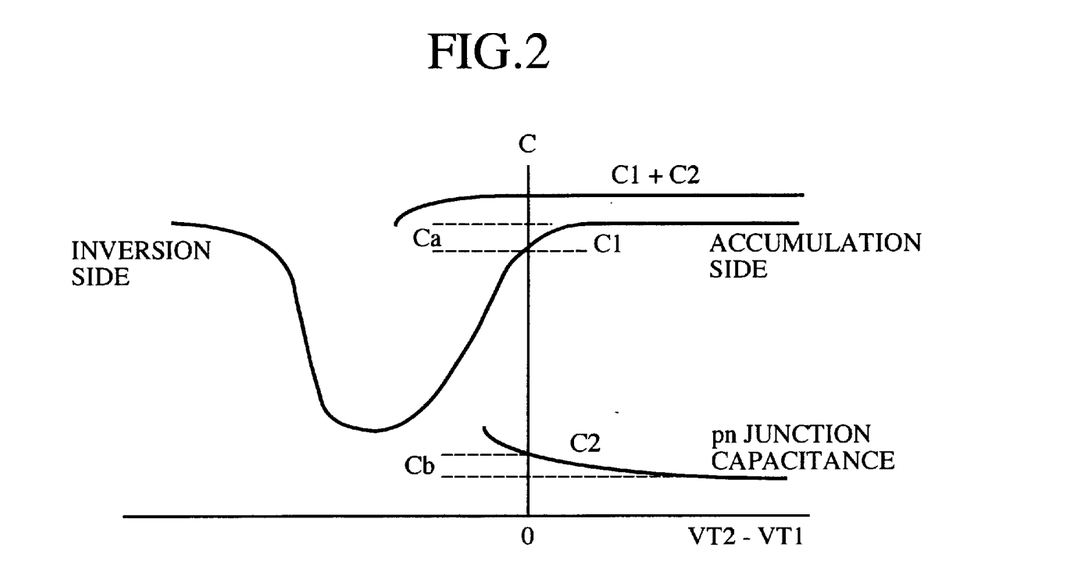
FIG. 2 is a CV curve showing the voltage dependence of the capacitance value in the capacitance element shown in FIG. 1.

FIG. 2 is a CV curve showing the voltage dependence of the capacitance value in this capacitance element. The horizontal axis shows the potential of the terminal T2 to the terminal T1. In the figure, reference symbols Ca and Cb represent an increment of the capacitance value in the capacitance C1, which increases when the potential of the gate electrode 6 to the n+ region 4 increases from 0 V to a positive voltage, and a decrement of the capacitance value in the capacitance C2 formed between the P well region 3 and the buried N well region 2, which reduces when the potential of this buried N well region 2 to the P well region 3 increases from 0 V to a positive voltage, respectively.

The operation will now be described below.

In the capacitance element in accordance with the embodiment 1, since one terminal T1 connecting together the lead wire A4 from the p+ active region 8 and the lead wire A2 from the n+ active region 7, and the other terminal T2 connecting together the lead wire A3 from the gate electrode and the lead wire A1 from the n+ active region 9 have been provided, a capacitance formed between one terminal T1 and the other terminal T2 shows the curve of combined capacitance C1+C2, obtained by adding the capacitance C1 to the capacitance C2 as shown in FIG. 2. As a result, the voltage dependence of the capacitance in the vicinity of 0 V (zero bias voltage) of the terminal voltage of the capacitance can be reduced.

Figure 3:
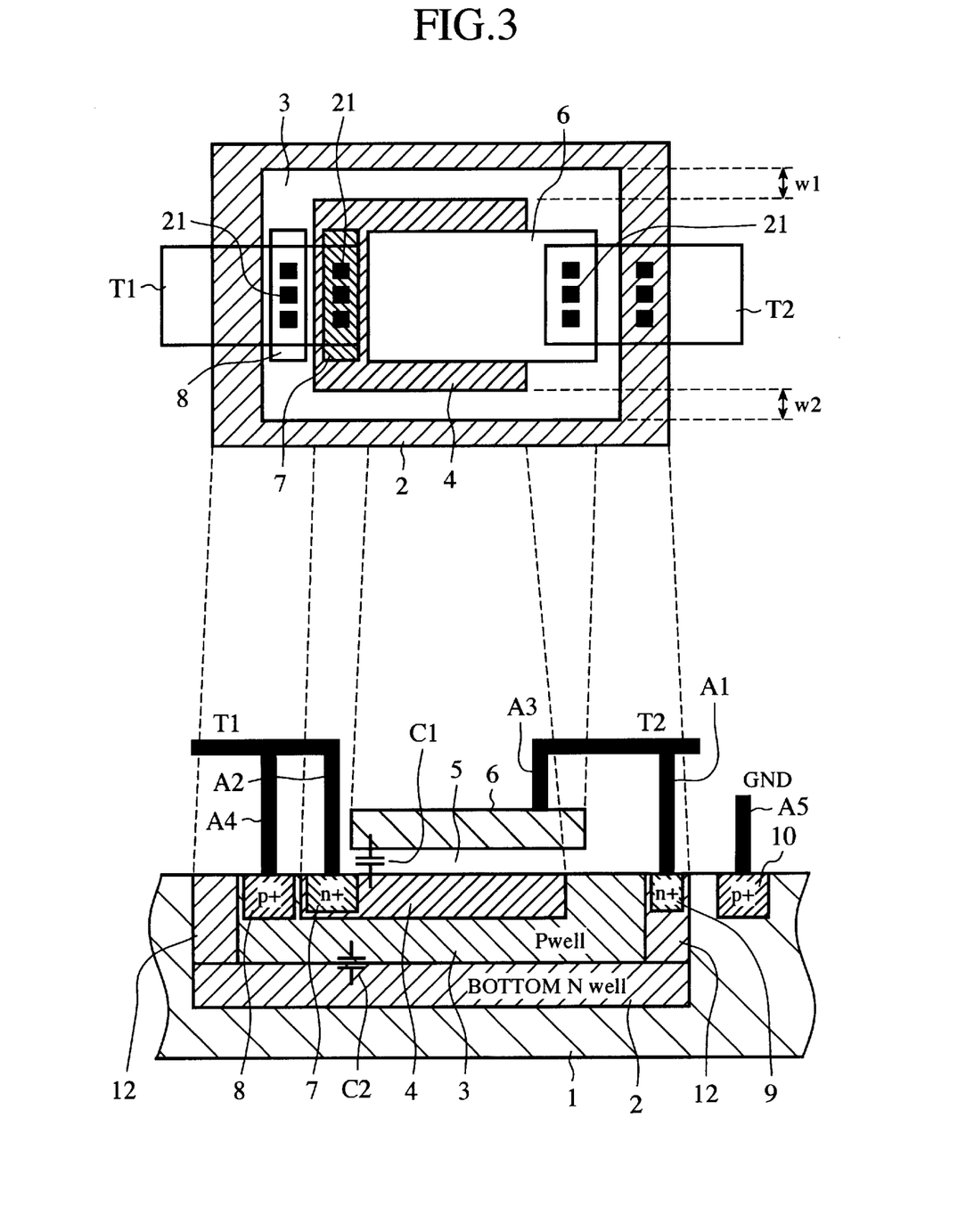
FIG. 3 is an example of the layout diagrams of the capacitance element shown in FIG. 1.

FIG. 3 is an example of the layout diagrams of the capacitance element according to the embodiment 1 shown in FIG. 1. In the figure, references symbols W1 and W2 each represent an adjusting width. Because the same parts are designated by similar references to the ones in FIG. 1, the explanation will be omitted.

The adjusting widths W1 and W2 are provided for correcting the voltage dependence of the capacitance C1 formed between the gate electrode 6 and the n+ active region 4. The adjusting widths W1 and W2 each are a space provided for adjusting the layout area of the n+ active region 4 so that the value of the combined capacitance C1+C2, which is obtained by adding the capacitance C1 to the pn junction capacitance C2 that is formed between the P well region 3 and the buried N well region 2, can be set to the same value or constant in the vicinity of zero bias voltage. The values of the capacitance Ca and the capacitance Cb shown in FIG. 2 can be arranged to be canceled out to each other by properly adjusting the widths W1 and W2. In such a way, the voltage dependence of the capacitance element in the vicinity of zero bias voltage can be reduced.

Basically, the configuration of the capacitance element according to the embodiment 1 produces a certain canceling effect without adjusting the adjusting widths W1 and W2. The effect of improving the voltage dependence can be obtained by only using the configuration thereof. However, in order to obtain a further improved effect, the properties of the capacitance elements having different W1 and W2 in size are measured to thereby determine the element having these proper sizes. Thus, the capacitance element can be produced under optimum conditions.

As mentioned above, in accordance with the embodiment 1 since the MOS capacitance can be arranged such that one terminal T1 is formed by connecting the P well region 3 and the n+ active region 4, and the other terminal T2 is formed by connecting the gate electrode 6 and the terminal of the buried N well region 2, the voltage dependence of the capacitance C1 formed between the gate electrode 6 and the n+ active regions 4 can be compensated with the voltage dependence of the capacitance C2 formed between the buried N well region 2 and the P well region 3. As a result, the capacitance element having small voltage dependence can be produced.

Embodiment 2

Figure 4:
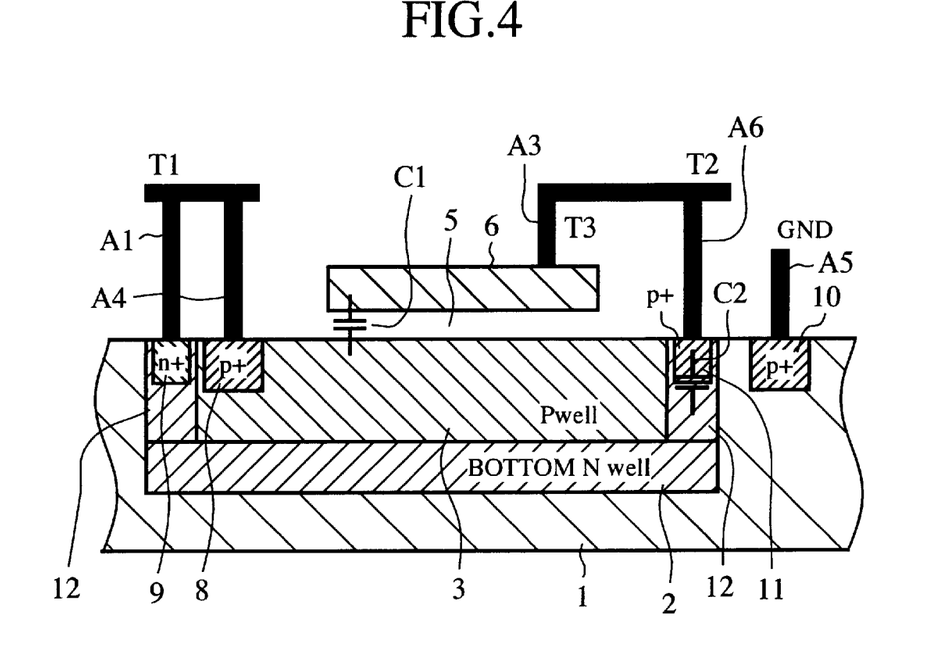
FIG. 4 is a schematic sectional view showing the capacitance element in accordance with an embodiment 2 of the present invention.

FIG. 4 is a schematic sectional view showing a capacitance element of an embodiment 2 of the present invention. Referring to the figure, reference numeral 1 denotes a p type semiconductor substrate; 2 denotes a buried N well region; 3 denotes a P well region; 5 denotes an insulation film such as an oxide film; 6 denotes a gate electrode formed of polysilicon or the like; 8 denotes a p+ active region formed within the P well region 3; 9 denotes another n+ active region formed on leading N well region 12; 10 denotes another p+ active region formed outside the area of the buried N well region 2; 11 denotes a p+ active region formed on the leading N well region 12; and 12 denotes a leading N well region that electrically leads out the buried N well region 2 to the upper portion. Reference symbol A1 represents a lead wire from the other n+ active region 9; A3 represents a lead wire from the gate electrode 6; A4 represents a lead wire from the p+ active region 8; and A5 represents a lead wire from the other p+ active region 10. The lead wire A5 is connected with the ground GND. Further, T1 represents one terminal; T2 represents the other terminal; and T5 represents a ground terminal. C1 represents a capacitance formed between the gate electrode 6 and the P well region 3.

In the figure, the one terminal T1 connects together the lead wire A1 from the n+ active region 9 and the lead wire A4 from the p+ active region 8. The other terminal T2 connects together the lead wire A3 from the gate electrode 6 and the lead wire A6 from the p+ active region 11.

Figure 5:
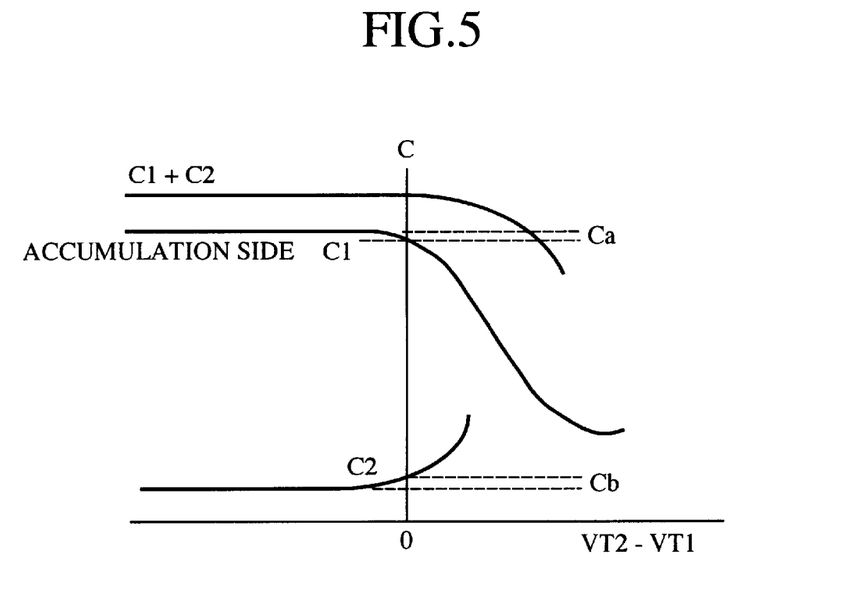
FIG. 5 is a CV curve showing the voltage dependence of the capacitance value in the capacitance element shown in FIG. 4.

FIG. 5 is a CV curve showing the voltage dependence of the capacitance value in this capacitance element. The horizontal axis represents the potential of the terminal T2 to the terminal T1. Referring to the figure, reference symbols C1 and C2 each represent a capacitance formed between the gate electrode 6 and the P well region 3, and a capacitance formed between the p+ active region 11 and the N well region 12, respectively. Ca and Cb represent a decrement of the capacitance value in the capacitance C1, which is produced when the potential of the gate electrode 6 to the P well region 3 increases from a negative voltage to 0 V, and an increment of the capacitance value in the capacitance formed between the P+ active region 11 and the N well region 12, which is produced when the potential of the p+ active region 11 to the N well region 12 increases from a negative voltage to 0 V, respectively.

The operation will now be described as below.

In the capacitance element according to the embodiment 2, because the terminal T1 connecting together the lead wire A4 from the p+ active region 8 and the lead wire A1 from the n+ active region 9 and the terminal T2 connecting together the lead wire A3 from the gate electrode 6 and the lead wire A6 from the p+ active region 11 have been provided, the capacitance formed between the one terminal T1 and the other terminal T2 represents the curve of capacitance C1+C2, obtained by adding the capacitance C1 to the capacitance C2 as shown in FIG. 5. As a result, the voltage dependence of the capacitance in the vicinity of 0 V (zero bias voltage) of the terminal voltage of the capacitor can be reduced.

Thereby, because the dependence of the capacitor CH on voltage reduces when the sample holding circuit shown in FIG. 9 is used, a high-precision sample holding circuit can be produced.

Figure 6:
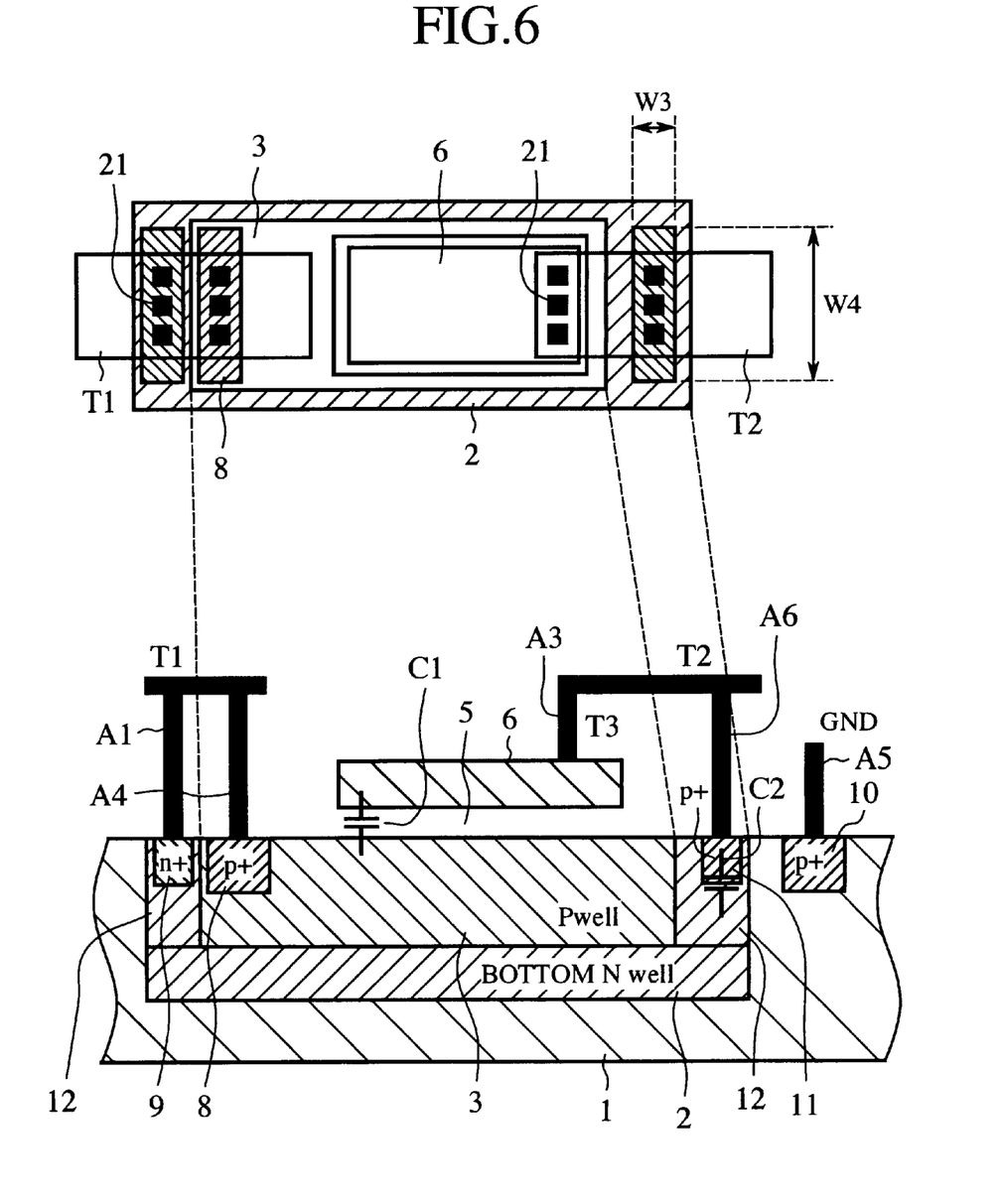
FIG. 6 is an example of the layout diagrams of the capacitance element shown in FIG. 4.

FIG. 6 is an example of the layout diagrams of the capacitance element according to the embodiment 2 shown in FIG. 4. Referring to the figure, references symbols W3 and W4 each represent an adjusting width. Because the same parts are designated by similar references to the ones in FIG. 4, the explanation is omitted.

In the figure, the adjusting widths W3 and W4 are provided for improving the voltage dependence of the capacitance C1 formed between the gate electrode 6 and the p well region 3. The adjusting widths W3 and W4 are provided for adjusting the space of the p+ active region 11 such that the value of the combined capacitance C1+C2, obtained by adding the capacitance C1 to the capacitance C2 of the pn junction which is formed between the P+ active region 11 and the N well region 12 is the same value or constant in the vicinity of zero bias voltage. The widths W3 and W4 can be arranged by properly adjusting them so that the values of the capacitances Ca and Cb can be canceled or balanced out to each other, as shown in FIG. 5. Although it is not possible to use the invention to forward bias, the voltage dependence of the capacitance element is thereby improved within a limited range of voltage. At least, the voltage dependence of the capacitance element in the vicinity of zero bias voltage is improved.

Hereinabove, the capacitance element having three contacts in areas, aligned in a row is shown in FIG. 3, and also in FIG. 6. However, the invention is not limited only to these examples. Needless to say, the same effect can be obtained when contacts aligned in two or three rows, or any number of contacts is used. In addition, only one combination of the conduction types of semiconductor is shown in the embodiment 1, and also in the embodiment 2. However, the same effect is also obtained by a configuration in which a replacement between p type and n type (for instance, the configuration in which a n type semiconductor substrate is used) is done.

As mentioned above, according to the embodiment 2 because the capacitance was arranged such that one terminal T1 is formed by connecting the gate electrode 6 and the electrode of the P+ active region 8 formed on the buried N well region 2, and the other terminal T2 is formed by connecting the p+ active region 11 and the leading N well region 12, the voltage dependence of the capacitance C1 formed between the gate electrode 6 and the P well region 3 and the voltage dependence of the capacitance C2 formed between the p+ active region 11 and the buried N well region 2 can be balanced out to each other. As a result, the capacitance element having small voltage dependence can be produced.

What is claimed is:

1. A capacitance element comprising:

a first conduction type semiconductor substrate;

a second conduction type buried well region formed within said semiconductor substrate;

a first conduction type well region formed on said buried well region;

a second conduction type active region having a high impurity concentration, and formed on said first conduction type well region; and a gate electrode disposed on said second conduction type active region through an oxide film, wherein said second conduction type active region and said first conduction type well region electrically connected with each other serve as one terminal, and the gate electrode and the buried well region electrically connected with each other serve as the other terminal.

2. The capacitance element according to claim 1, wherein the second conduction type buried well region has a leading second conduction type well region for electrically leading the second conduction type buried well region, formed between the second conduction type buried well region and the other terminal.

3. The capacitance element according to claim 1, wherein a first amount of change in the capacitance of a capacitor formed between the second conduction type active region having a high impurity concentration and the gate electrode is caused when the potential of the gate electrode to the second conduction type active region reduces from a positive voltage to 0 V, a second amount of change in the capacitance of a capacitor formed between the second conduction type buried well region and the first conduction type well region is caused when the potential of the second conduction type buried well region to the first conduction type well region reduces from a positive voltage to 0 V, and the first and second amounts of change are balanced out to each other.

4. A capacitance element comprising:

a first conduction type semiconductor substrate;

a second conduction type buried well region formed within said semiconductor substrate;

a first conduction type well region formed on said buried well region;

a gate electrode disposed on said first conduction type well region through an oxide film;

a leading second conduction type well region, formed on the buried well region, for electrically leading said buried well region; and a first conduction type active region having a high impurity concentration, and disposed on said leading second conduction type well region, wherein said first conduction type well region serves as one terminal, and said gate electrode and said first conduction type active region electrically connected with each other serve as the other terminal.

5. The capacitance element according to claim 4, wherein a first amount of change in the capacitance of a capacitor formed between the first conduction type well region and the gate electrode is caused when the potential of the gate electrode to the first conduction type well region increases from a negative voltage to 0 V, and a second amount of change in the capacitance of a capacitor formed between the leading second conduction type well region and the first conduction type active region formed thereon is caused when the potential of the leading well region to the first conduction type active region increases from a negative voltage to 0 V, and the first and second amounts of change are balanced out to each other.

* * * * *